(12) United States Patent
Taira

(10) Patent No.: US 11,562,892 B2
(45) Date of Patent: Jan. 24, 2023

(54) DIELECTRIC MEMBER, STRUCTURE, AND SUBSTRATE PROCESSING APPARATUS

(71) Applicant: Tokyo Electron Limited, Tokyo (JP)

(72) Inventor: Takashi Taira, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 53 days.

(21) Appl. No.: 17/014,138

(22) Filed: Sep. 8, 2020

(65) Prior Publication Data

US 2021/0090864 A1 Mar. 25, 2021

(30) Foreign Application Priority Data

Sep. 20, 2019 (JP) .............................. JP2019-172298

(51) Int. Cl.
*H01L 21/00* (2006.01)
*H01J 37/32* (2006.01)
*C23C 16/46* (2006.01)
*C23C 16/458* (2006.01)

(52) U.S. Cl.
CPC .... *H01J 37/32724* (2013.01); *C23C 16/4586* (2013.01); *C23C 16/46* (2013.01); *H01J 37/3244* (2013.01); *H01J 37/32082* (2013.01); *H01J 37/32348* (2013.01); *H01J 37/32532* (2013.01)

(58) Field of Classification Search
None
See application file for complete search history.

(56) References Cited

U.S. PATENT DOCUMENTS

| 6,191,045 | B1* | 2/2001 | Yoshigai | H01L 21/32136 438/719 |
| 2004/0027781 | A1* | 2/2004 | Hanawa | H01J 37/32706 361/234 |
| 2004/0065259 | A1* | 4/2004 | Inazumachi | H01L 21/67109 118/724 |
| 2006/0207725 | A1* | 9/2006 | Oohashi | H01L 21/67109 216/58 |
| 2010/0083902 | A1* | 4/2010 | Kim | H01L 21/68785 118/723 R |
| 2019/0027345 | A1* | 1/2019 | Ishikawa | H01J 37/32981 |
| 2020/0185248 | A1* | 6/2020 | Sarode Vishwanath | ................... H01L 21/67213 |

FOREIGN PATENT DOCUMENTS

JP 2000-003904 1/2000

* cited by examiner

*Primary Examiner* — Sylvia Macarthur
*Assistant Examiner* — Michelle Crowell
(74) *Attorney, Agent, or Firm* — IPUSA, PLLC

(57) ABSTRACT

A dielectric member that is attached to a lower surface of a stage is provided. The stage includes a base provided with a base channel through which a heat exchange medium passes. The dielectric member includes at least one first component including a passage that is connected to the base channel, and a second component surrounding the first component.

19 Claims, 2 Drawing Sheets

US 11,562,892 B2

DIELECTRIC MEMBER, STRUCTURE, AND SUBSTRATE PROCESSING APPARATUS

CROSS-REFERENCE TO RELATED APPLICATIONS

This patent application is based on and claims priority to Japanese Patent Application No. 2019-172298 filed on Sep. 20, 2019, the entire contents of which are incorporated herein by reference.

TECHNICAL FIELD

The present disclosure relates to a dielectric member, a structure, and a substrate processing apparatus.

BACKGROUND

A substrate processing apparatus is known, in which a substrate placed on a stage is subjected to plasma processing.

Patent Document 1 describes an electrostatic chuck device in which a cushioning material is provided in the gap between electrode supports, to relieve stress caused by thermal expansion and thermal contraction.

RELATED ART DOCUMENT

Patent Document

[Patent Document 1] Japanese Laid-open Patent Application Publication No. 2000-003904

SUMMARY

In one aspect, the present disclosure provides a dielectric member, a structure, and a substrate processing apparatus that prevent breakage due to thermal stress even if the temperature of a heat exchange medium supplied to a channel in a stage is changed.

In order to solve the above problem, according to one aspect, a dielectric member that is attached to a lower surface of a stage is provided. The stage includes a base provided with a base channel through which a heat exchange medium passes. The dielectric member includes at least one first component including a passage that is connected to the base channel, and a second component surrounding the first component.

DETAILED DESCRIPTION OF EMBODIMENTS

In the following, embodiments for carrying out the present disclosure will be described with reference to the drawings. In each drawing, elements having identical features are given the same reference symbols and overlapping descriptions may be omitted.

<Substrate Processing Apparatus>

Figure 1:
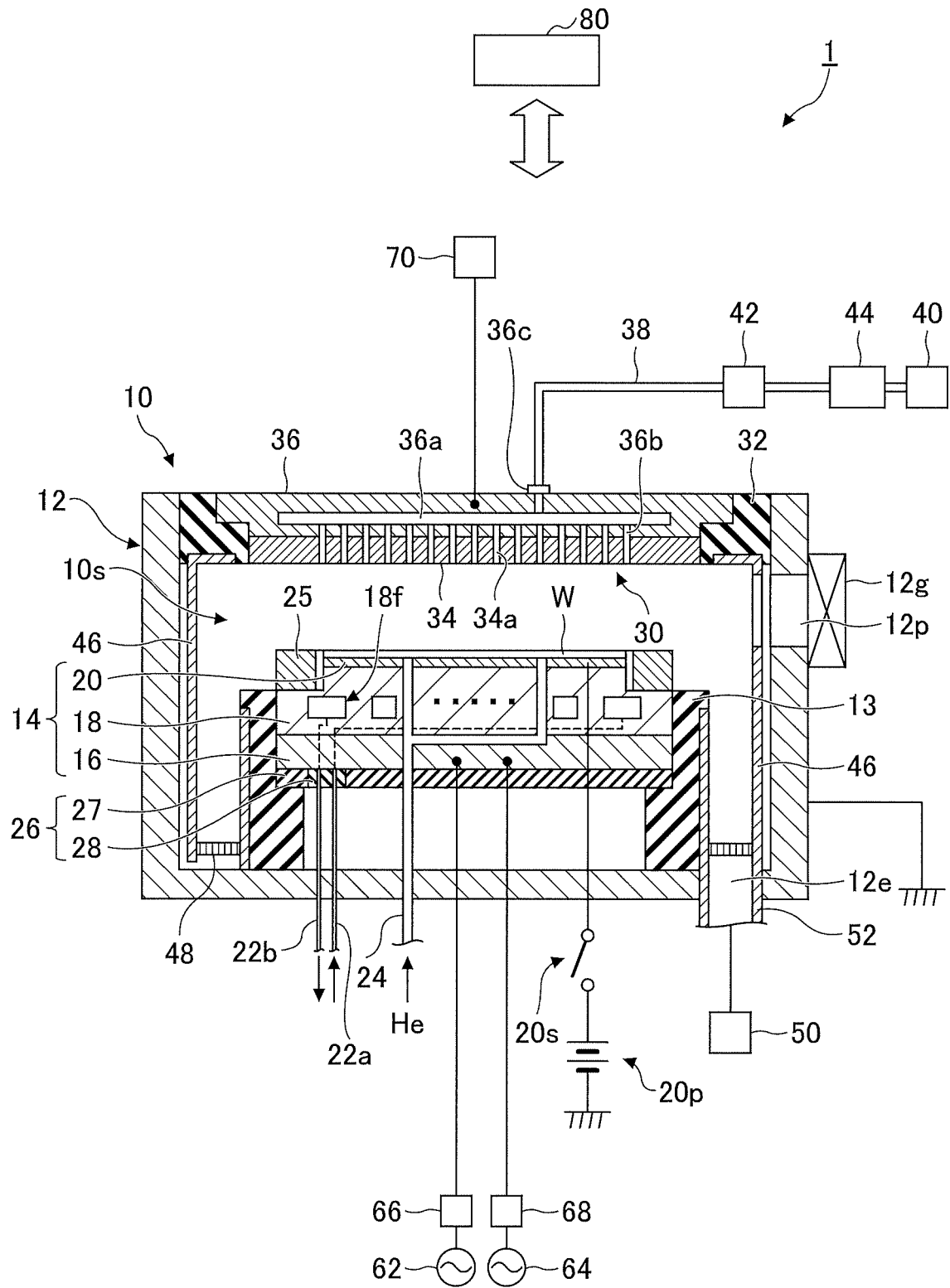
FIG. 1 is a cross-sectional view illustrating an example of a substrate processing apparatus according to an embodiment.

A substrate processing apparatus 1 according to an embodiment will be described with reference to FIG. 1. FIG. 1 is a cross-sectional view illustrating an example of the substrate processing apparatus 1 according to the present embodiment.

The substrate processing apparatus 1 includes a chamber 10. The chamber 10 provides an interior space 10s therein. The chamber 10 includes a chamber body 12. The chamber body 12 is generally cylindrical in shape. The chamber body 12 is formed of, for example, aluminum. A corrosion resistant film is provided on the inner wall of the chamber body 12. The film may be formed of ceramic such as aluminum oxide and yttrium oxide.

A passage 12p is formed in the side wall of the chamber body 12. A substrate W is transferred between the interior space 10s and the exterior of the chamber 10 through the passage 12p. The passage 12p is opened and closed by a gate valve 12g provided along the side wall of the chamber body 12.

A support 13 is provided on the bottom of the chamber body 12. The support 13 is formed of an insulating material. The support 13 is generally cylindrical in shape. The support 13 extends upward from the bottom of the chamber body 12 in the interior space 10s. At the upper portion of the support 13, a stage 14 is provided. The stage 14 is configured to support the substrate W in the interior space 10s.

The stage 14 includes a lower electrode 18 and an electrostatic chuck 20. The stage 14 may further include an electrode plate 16. In the present specification, a set of the lower electrode 18 and the electrode plate 16 is referred to as a "base". The electrode plate 16 is formed of a conductor such as aluminum, and is generally disc-shaped. The lower electrode 18 is disposed on the electrode plate 16. The lower electrode 18 is formed of a conductor such as aluminum, and is generally disc-shaped. The lower electrode 18 is electrically connected to the electrode plate 16.

The electrostatic chuck 20 is provided on the lower electrode 18. A substrate W is placed on the upper surface of the electrostatic chuck 20. The electrostatic chuck 20 includes a body and an electrode (not illustrated). The body of the electrostatic chuck 20 is generally disc-shaped, and is formed of a dielectric material. The electrode of the electrostatic chuck 20 is a film-like electrode provided within the body of the electrostatic chuck 20. The electrode of the electrostatic chuck 20 is connected to a direct-current (DC) power supply 20p via a switch 20s. When voltage from the DC power supply 20p is applied to the electrode of the electrostatic chuck 20, electrostatic attractive force is generated between the electrostatic chuck 20 and the substrate W. By the electrostatic attractive force, the substrate W is held by the electrostatic chuck 20. Also, the electrostatic chuck 20 is provided with a heater (not illustrated).

An edge ring 25 is disposed on a periphery of the lower electrode 18 to surround the edge of the substrate W. The edge ring 25 improves in-plane uniformity of plasma processing applied to the substrate W. The edge ring 25 may be formed of silicon, silicon carbide, quartz, or the like.

A flow passage (base channel) 18f is provided within the lower electrode 18. A heat exchange medium (e.g., refrigerant) is supplied to the flow passage 18f from a chiller unit (not illustrated) provided outside the chamber 10 through a pipe 22a. The heat exchange medium supplied to the flow passage 18f is returned to the chiller unit via a pipe 22b. In the substrate processing apparatus 1, the temperature of the substrate W placed on the electrostatic chuck 20 is adjusted by heat exchange between the heat exchange medium and the lower electrode 18 and by a heater (not illustrated).

The substrate processing apparatus 1 is provided with a gas supply line 24. The gas supply line 24 supplies heat transfer gas (e.g., He gas) from a heat transfer gas supply mechanism to a gap between the upper surface of the electrostatic chuck 20 and the bottom surface of the substrate W.

The substrate processing apparatus 1 further comprises an upper electrode 30. The upper electrode 30 is provided above the stage 14. The upper electrode 30 is supported on the top of the chamber body 12 via a member 32. The member 32 is formed of an insulating material. The upper electrode 30 and the member 32 occlude the top opening of the chamber body 12.

The upper electrode 30 may include a top plate 34 and a support 36. The lower surface of the top plate 34 is exposed to the interior space 10s, and defines the interior space 10s. The top plate 34 may be formed of a low resistance conductor or semiconductor with low Joule heat generation. The top plate 34 has multiple gas discharge holes 34a penetrating the top plate 34 in a thickness direction of the top plate 34.

The support 36 removably supports the top plate 34. The support 36 is formed of an electrically conductive material such as aluminum. Inside the support 36, a gas diffusion chamber 36a is provided. The support 36 has multiple gas holes 36b extending downward from the gas diffusion chamber 36a. The multiple gas holes 36b communicate with the multiple gas discharge holes 34a, respectively. A gas inlet 36c is formed in the support 36. The gas inlet 36c is connected to the gas diffusion chamber 36a. A gas supply line 38 is connected to the gas inlet 36c.

Valves 42, flow controllers 44, and gas sources 40 are connected to the gas supply line 38. The gas sources 40, the valves 42, and the flow controllers 44 constitute a gas supply section. Each of the valves 42 may be an open/close valve. Each of the flow controllers 44 is a mass flow controller or a pressure-controlled flow controller. Each of the gas sources 40 is connected to the gas supply line 38 via a corresponding open/close valve of the valves 42 and a corresponding flow controller of the flow controllers 44.

In the substrate processing apparatus 1, a shield 46 is removably provided along the inner wall surface of the chamber body 12 and the outer circumference of the support 13. The shield 46 prevents reaction by-products from adhering to the chamber body 12. The shield 46 is constructed by, for example, forming a corrosion resistant film on the surface of a member formed of aluminum. The corrosion resistant film may be formed of ceramic such as yttrium oxide.

A baffle plate 48 is provided between the outer side wall of the support 13 and the inner side wall of the chamber body 12. The baffle plate 43 is constructed by, for example, forming a corrosion-resistant film (a film such as yttrium oxide) on the surface of a member formed from aluminum. Multiple through-holes are formed in the baffle plate 48. An exhaust port 12e is provided below the baffle plate 48, at the bottom of the chamber body 12. An exhaust device 50 is connected to the exhaust port 12e via an exhaust pipe 52. The exhaust device 50 includes a pressure regulating valve and a vacuum pump such as a turbomolecular pump.

The substrate processing apparatus 1 includes a first radio frequency power supply 62 and a second radio frequency power supply 64. The first radio frequency power supply 62 is a power source that generates first radio frequency power. The first radio frequency power has a frequency suitable for generating a plasma. The frequency of the first radio frequency power is, for example, a frequency in the range of 27 MHz to 100 MHz. The first radio frequency power supply 62 is connected to the lower electrode 18 via a matcher 66 and the electrode plate 16. The matcher 66 includes circuitry for causing the output impedance of the first radio frequency power supply 62 to match impedance of the load side (lower electrode 18 side). The first radio frequency power supply 62 may be connected to the upper electrode 30 via the matcher 66. The first radio frequency power supply 62 constitutes an exemplary plasma generator.

The second radio frequency power supply 64 is a power source that generates second radio frequency power. The second radio frequency power has a frequency lower than the frequency of the first radio frequency power. In a case in which the second radio frequency power is used in conjunction with the first radio frequency power, the second radio frequency power is used as radio frequency power for biasing to draw ions into the substrate W. The frequency of the second radio frequency power is, for example, a frequency in the range of 400 kHz to 13.56 MHz. The second radio frequency power supply 64 is connected to the lower electrode 18 via a matcher 68 and the electrode plate 16. The matcher 68 includes circuitry for causing the output impedance of the second radio frequency power supply 64 to match impedance of the load side (lower electrode 18 side).

It should be noted that a plasma may be generated using the second radio frequency power, without using a first radio frequency power. That is, a plasma may be generated using only single radio frequency power. In such a case, the frequency of the second radio frequency power may be greater than 13.56 MHz, for example 40 MHz. In this case, the substrate processing apparatus 1 may not include the first radio frequency power supply 62 and the matcher 66. The second radio frequency power supply 64 constitutes an exemplary plasma generator.

In the substrate processing apparatus 1, gas is supplied from the gas supply to the interior space 10s to produce a plasma. Also, as the first radio frequency power and/or the second radio frequency power are supplied, a radio frequency electric field is generated between the upper electrode 30 and the lower electrode 18. The generated radio frequency electric field generates a plasma.

The substrate processing apparatus 1 includes a power supply 70. The power supply 70 is connected to the upper electrode 30. The power supply 70 applies voltage to the upper electrode 30 to draw positive ions that are present, in the interior space 10s into the top plate 34.

The substrate processing apparatus 1 may further include a controller 80. The controller 80 may be a computer including a processor, a storage device such as a memory, an input device, a display device, an input/output interface of a signal, or the like. The controller 80 controls each part of the substrate processing apparatus 1. An operator can perform input operations of commands to manage the substrate processing apparatus 1, by using the input device of the controller 80. The controller 80 can also display an operation status of the substrate processing apparatus 1 on the display device, further, a control program and recipe data are stored in the storage device. The control program is executed by the processor to cause the substrate processing apparatus 1 to perform various processes. The processor executes the control program, and controls each part of the substrate processing apparatus 1 in accordance with the recipe data.

The first radio frequency power and the second radio frequency power are applied from the bottom center of the electrode plate 16, and are supplied to the lower electrode 18 while being transmitted through the surface of the electrode plate 16. Thus, a dielectric plate (dielectric member) 26 is provided to cover the lower surface of the electrode plate 16.

Figure 2:
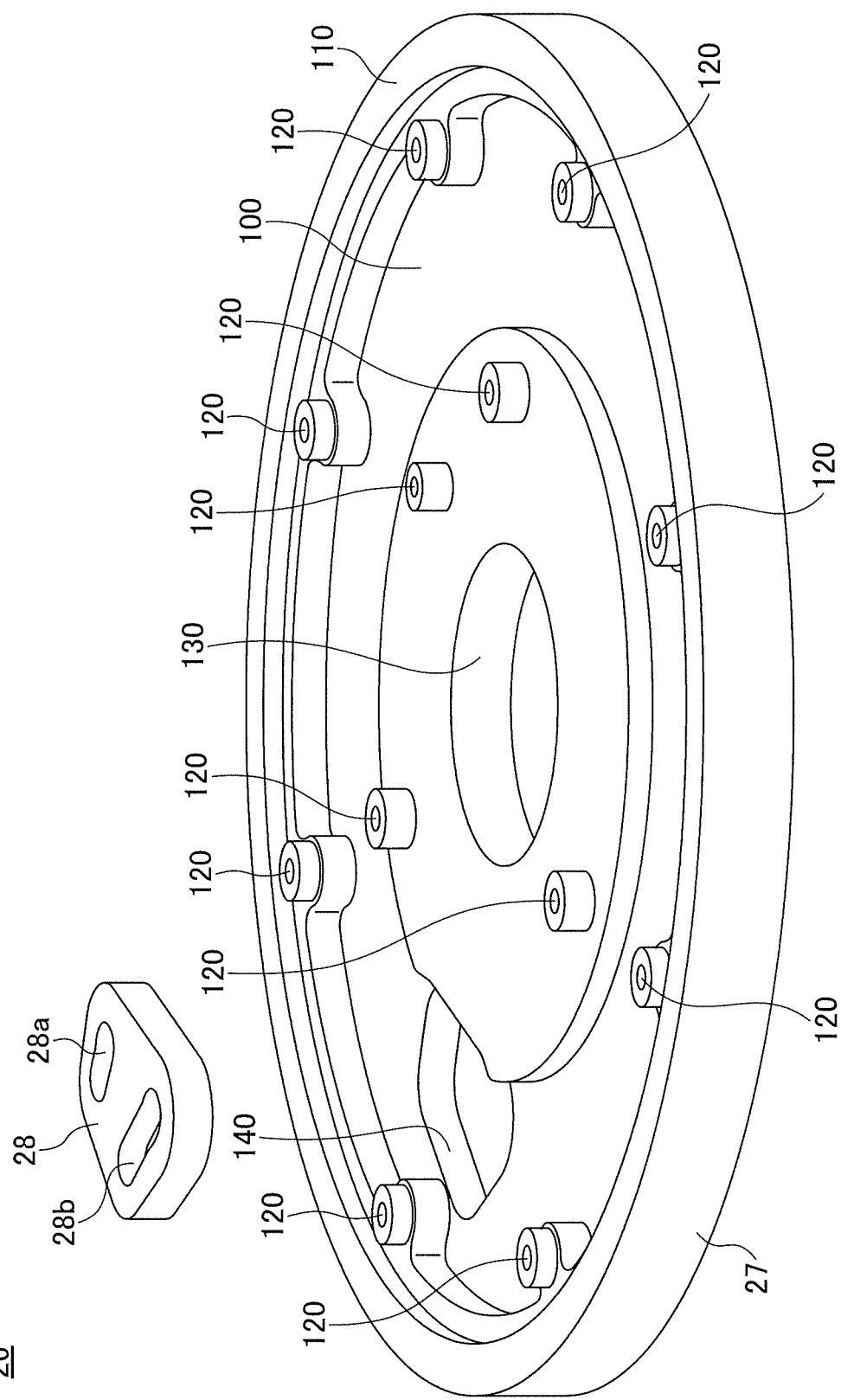
FIG. 2 is an exploded perspective view illustrating an example of a dielectric plate.

The dielectric plate 26 will be described further. FIG. 2 is an exploded perspective view of an example of the dielectric plate 26. The dielectric plate 26 includes a plate body (second component) 27 and a block (first component) 28. The dielectric plate 26 (plate body 27 and block 28) is formed of a dielectric material, specifically formed of ceramic.

The plate body 27 includes a bottom plate portion 100 and a side wall portion 110. The electrode plate 16 is disposed in a space formed by the bottom plate portion 100 and the side wall portion 110. Multiple upright portions 120 each extending upward are formed on the bottom plate portion 100. In a state in which the electrode plate 16 is disposed in the space formed by the bottom plate portion 100 and the side wall portion 110, the upright portions 120 abut the electrode plate 16. The plate body 27 is secured to the electrode plate 16 with the upright portions 120. The plate body 27 includes an opening (second opening) 130, which is formed substantially in the center of the bottom plate portion 100. A power feeding rod (not illustrated) is passed through the opening 130, one end of which is connected to the electrode plate 16, and the other end of which is connected to the first radio frequency power supply 62 and/or the second radio frequency power supply 64.

An opening (first opening) 140 for displacing the block 28 is formed in the plate body 27 at a location away from the center of the plate body 27. In other words, the opening 140 for placing the block 28 is formed to avoid the opening 130 formed substantially in the center of the plate body 27. This allows high frequency power to be supplied from the substantial center of the electrode plate 16, thereby improving the circumferential uniformity of the high frequency power transmitted to the lower electrode 18.

In the block 23, flow passages 28a and 28b are formed. The heat exchange medium, which is supplied from the outside of the chamber 10 via the pipe 22a, passes through the flow passage 28a, and is supplied to one end of the flow passage 18f in the lower electrode 18. The heat transfer medium, which flows out of the other end of the flow passage 18f in the lower electrode 18, passes through the flow passage 28b and is drained out of the chamber 10 via the pipe 22b.

The opening 140 is formed to be larger than the size of the block 28. The block 28 is disposed within the opening 140, and is secured to the electrode plate 16. Between the block 28 and the opening 140, a gap (e.g., 1 mm) is formed. Therefore, the sidewall of the block 28 is not in contact with the sidewall of opening 140, and therefore thermal conduction is suppressed.

In processing the substrate W, in order to change the temperature of the substrate W (temperature of the stage 14), it is required to change the temperature of the heat exchange medium supplied to the flow passage 18f of the lower electrode 18. For example, if the temperature of the heat exchange medium is supplied at a first temperature (for example, 0° C.), the temperature of the base and the dielectric plate 26 will become approximately equal to the first temperature in a steady state. Here, if the temperature of the heat exchange medium supplied is changed to a second temperature (for example, 150° C.) higher than the first temperature, heat is rapidly propagated in the base formed of metal (for example, aluminum), and the temperature difference in the base becomes small.

In contrast, the dielectric plate 26 formed of dielectric has lower thermal conductivity than the base. Therefore, unlike the dielectric plate 26 according to the present embodiment, if the flow passages 28a and 28b are formed in the plate body 27, the temperature rises near the flow passages 28a and 28b through which the high-temperature heat exchange medium passes, but the temperature does not rise at the outer periphery of the dielectric plate 26. Therefore, thermal stress concentration may occur due to temperature differences in the dielectric plate 26.

In the dielectric plate 26 illustrated in FIG. 2, the block 28 having the flow passages 28a and 28b is provided separately from the plate body 27. When a high temperature heat exchange medium flows through the flow passages 28a and 23b, the temperature of the block 28 increases. Here, the block 28 is formed to be smaller than the plate body 27 and has a smaller heat capacity than the plate body 27. Therefore, heat in the heat exchange medium is propagated throughout the block 28. This can suppress occurrence of non-uniform temperature distribution in the block 28, and occurrence of thermal stress concentration can be avoided.

Further, because a gap is provided between the opening 140 of the plate body 27 and the block 28, sudden temperature rise near the opening 140 of the plate body 27 can be suppressed. Thus, occurrence of non-uniform temperature distribution in the plate body 27 can be reduced to suppress thermal stress concentration.

Also, as the opening 140 is larger than the block 28, even if thermal expansion of the block 28 occurs, generation of stress that attempts to expand the opening 140 is prevented. Thus, stress generation in the plate body 27 due to thermal expansion of the block 28 can be suppressed, and stress concentration can be suppressed.

Also, by supplying a high temperature heat exchange medium to the flow passage 18f of the lower electrode 18 through the block 28, the temperature of the lower electrode 18 rises and the temperature of the electrode plate 16 also rises. Then, heat is transferred to the plate body 27 from the upright portions 120, which are in contact with the electrode plate 16. Because heat is transferred from the electrode plate 16 to the plate body 27 as described above, the plate body 21 is prevented from being heated locally. This reduces stress concentration due to thermal stress.

As described above, the structure including the stage 14 and the dielectric plate 26 can suppress stress concentration caused by temperature differences in the dielectric plate 26, and deformation and breakage of the dielectric plate 26 is prevented, even if the temperature of the heat exchange medium is changed rapidly. Also, the substrate processing apparatus 1, which includes the dielectric plate 26 according to the present embodiment, can expand a temperature range of a heat exchange medium, supplied to the flow passage 18f. Therefore, in the substrate processing apparatus 1, processes each being performed at different substrate temperatures (different temperatures in the stage 14) can be applied to the substrate W. In addition, even if the temperature of the heat exchange medium is changed rapidly, deformation or breakage of the dielectric plate 26 can be suppressed. Therefore, time required for switching the temperature of the heat exchange medium can be reduced.

The dielectric member (dielectric plate 26), the structure including the stage 14 and the dielectric plate 26, and the substrate processing apparatus have been described above. However, the present invention is not limited to the above-described embodiment, and various modifications and enhancement can be made within the scope of the gist of the present disclosure described in the claims.

In the above-described embodiment, a case in which only a single block 28 separate from the plate body 27 is provided in the dielectric plate 26 has been described, but the dielectric plate 26 is not limited to the case. For example, there may be a case in which a substrate W to be placed on the stage 14 is divided into multiple zones (e.g., concentric zones), and temperature of the substrate W is controlled in each of the zones. In such a case, for each of the zones, a different flow passage 18f is formed in the lower electrode 18. In a case in which multiple flow passages 18f are formed in the lower electrode 18 as described above, blocks 28 may be provided in the respective flow passages 18f. Also, multiple openings 140 may be formed in the plate body 27 for the respective blocks 28. Accordingly, even if the heat exchange medium having a different temperature is supplied to each of the flow passages 18f, occurrence of non-uniform temperature distribution can be suppressed in each of the blocks 28, so that thermal stress concentration can be suppressed.

What is claimed is:

1. A dielectric member that is attached to a lower surface of a stage, the stage including a base to which a radio frequency power is to be applied, the base being provided with a base channel through which a heat exchange medium flows, the dielectric member comprising:
    at least one first component including a passage that is connected to the base channel; and
    a second component surrounding the first component,
    wherein the first component and the second component respectively have a first surface and a second surface that cover an entirety of the lower surface of the stage; and wherein the second component has an opening for inserting a feed rod into the second component, the opening being provided in a central portion of the second component.

2. The dielectric member according to claim 1, wherein the dielectric member is formed of ceramic.

3. The dielectric member according to claim 1, wherein the second component includes at least one opening in which the first component is disposed, the opening being provided at a location away from a center of the second component.

4. The dielectric member according to claim 1, wherein the passage in the first component is provided with two passages.

5. The dielectric member according to claim 2, wherein the second component includes at least one opening in which the first component is disposed, the opening being provided at a location away from a center of the second component.

6. The dielectric member according to claim 5, wherein the passage in the first component is provided with two passages.

7. The dielectric member according to claim 2, wherein the passage in the first component is provided with two passages.

8. The dielectric member according to claim 3, wherein the passage in the first component is provided with two passages.

9. The dielectric member according to claim 1, wherein the second component further has a second opening in which the first component is disposed, the second opening being provided at a different location than the opening.

10. The dielectric member according to claim 1, wherein the second component is separated from the first component, and
    wherein the first component has a heat capacity that is lower than a heat capacity of the second component, such that a temperature difference within the first compartment is reduced in comparison to a temperature difference within the second compartment, upon occurrence of a condition in which heat of the heat exchange medium flowing through the base channel is transferred to the dielectric member.

11. A structure comprising:
    a stage including a base to which a radio frequency power is to be applied, the base being provided with a base channel through which a heat exchange medium flows; and
    a dielectric member attached to a lower surface of the stage, the dielectric member including
    at least one first component including a passage that is connected to the base channel; and
    a second component surrounding the first component,
    wherein the first component and the second component respectively have a first surface and a second surface that cover an entirety of the lower surface of the stage; and wherein the second component has an opening for inserting a feed rod into the second component, the opening being provided in a central portion of the second component.

12. The structure according to claim 11, wherein the dielectric member is formed of ceramic.

13. The structure according to claim 11, wherein the second component includes at least one opening in which the first component is disposed, the opening being provided at a location away from a center of the second component.

14. The structure according to claim 11, wherein the passage in the first component is provided with two passages.

15. The structure according to claim 12, wherein the second component includes at least one opening in which the first component is disposed, the opening being provided at a location away from a center of the second component.

16. The structure according to claim 15, wherein the passage in the first component is provided with two passages.

17. The structure according to claim 12, wherein the passage in the first component is provided with two passages.

18. The structure according to claim 13, wherein the passage in the first component is provided with two passages.

19. A substrate processing apparatus comprising the structure according to claim 11.

* * * * *